United States Patent

Boe

[11] Patent Number: 6,049,963
[45] Date of Patent: Apr. 18, 2000

[54] METHOD FOR MOUNTING AN ELEMENT

[75] Inventor: Craig L. Boe, Nampa, Id.

[73] Assignee: Micron Electronics, Inc., Nampa, Id.

[21] Appl. No.: 08/880,840

[22] Filed: Jun. 23, 1997

[51] Int. Cl.[7] .................................................. B23P 11/00
[52] U.S. Cl. ........................... 29/525.01; 29/453; 24/563; 403/397; 361/685; 361/747
[58] Field of Search ................... 29/453, 525.01; 24/563, 545, 295; 248/300, 500; 403/397, 329; 361/685, 686, 747

[56] References Cited

U.S. PATENT DOCUMENTS

| | | |
|---|---|---|
| 2,032,017 | 2/1936 | Hocher et al. . |
| 2,231,153 | 2/1941 | Camiener ..................................... 24/73 |
| 2,419,317 | 4/1947 | Hall . |
| 2,868,486 | 1/1959 | Poupitch . |
| 3,532,311 | 10/1970 | Havener . |
| 3,606,223 | 9/1971 | Havener ................................. 248/205 |
| 3,993,272 | 11/1976 | Lindeman . |
| 4,362,284 | 12/1982 | Bolante ................................... 403/387 |
| 4,745,524 | 5/1988 | Patton, III ............................... 361/399 |
| 4,786,121 | 11/1988 | Lyons .................................... 248/316.7 |
| 4,881,315 | 11/1989 | Powell et al. ............................. 29/450 |
| 4,906,201 | 3/1990 | Young et al. . |
| 4,949,934 | 8/1990 | Krenz et al. . |
| 5,015,802 | 5/1991 | Chi ............................................ 24/293 |
| 5,090,097 | 2/1992 | Koester, Jr. et al. ..................... 24/552 |
| 5,100,215 | 3/1992 | Cooke et al. ......................... 312/257.1 |
| 5,366,186 | 11/1994 | Weyeneth ................................ 248/27.3 |
| 5,461,541 | 10/1995 | Wentland, Jr. et al. . |
| 5,731,955 | 3/1998 | Bartanen et al. . |

*Primary Examiner*—David P. Bryant
*Assistant Examiner*—Jermie E. Cozart
*Attorney, Agent, or Firm*—Trop, Pruner & Hu, P.C.

[57] ABSTRACT

The present invention provides a method for mounting an element on a chassis. The method comprises several steps. The element is stopped from sliding in at least one direction when the element is placed on the surface of the chassis. A clip is pivotably connected to the chassis. The clip pivots between first and second position holding the element in place in the second position. The clip is locked in the second position.

4 Claims, 4 Drawing Sheets ns to owners.

METHOD FOR MOUNTING AN ELEMENT

This application is related to the inventor's U.S. patent application Ser. No. 08/877,716, filed Jun. 23, 1997, entitled APPARATUS FOR MOUNTING AN ELEMENT.

BACKGROUND OF THE INVENTION

1. Field of the Invention

The present invention relates generally to spring fasteners, and, more particularly, to a screwless mounting assembly for attaching a element to a computer chassis.

2. Description of Related Art

In constructing small machines such as computers, it is necessary to attach a variety of elements to a metal chassis frame. An important innovation in mini-computers has been the development of methods allowing owners to add or replace elements themselves. These innovations have enabled owners to inexpensively adapt and upgrade their machines. These additions and replacements have been facilitated by special attachment devices and methods.

Heretofore, screw-type mounting arrangements have been widely used. However, while mounting screws provide a firm fastening system, their use carries certain disadvantages. First, they require the use of tools for removal and installation. These tools are often very specialized due to cramped conditions inside the computer chassis. Second, to access mounting screws, it is often necessary to remove additional elements. For example, the removal of a hard drive from Micron Electronics Inc.'s ACTX computer requires unlatching the access cover, disassembling the front bezel, and then removing the two mounting screws. Complicated disassembly is time consuming and can cause damage to other parts of the computer. In the above-mentioned example, if adequate care is not taken, the hinges holding the bezel in place can be damaged when the front bezel is disassembled.

Complicated procedures for removal and installation of elements discourage inexpensive, owner-made changes. The disadvantages of the fastening systems of the prior art render computers less flexible to the evolving needs of the owner and to upgrades necessitated by technological advances. Unduly complicated fastening systems exacerbate efforts to increase the value of mini-computers as long term investments to owners.

The present invention is directed to overcoming, or at least reducing the effects of, one or more of the problems set forth above.

SUMMARY OF THE INVENTION

The invention disclosed and claimed herein comprises in various embodiments a method for mounting an element on a chassis. The method comprises several steps. The element is stopped from sliding in at least one direction when the element is placed on a surface of the chassis. A clip is pivotably connected to the chassis. The clip pivots between first and second positions holding the element in place in the second position. The clip is locked in the second position.

BRIEF DESCRIPTION OF THE DRAWINGS

The foregoing and other advantages of the invention will become apparent upon reading the following detailed description and upon reference to the drawings in which.

DESCRIPTION OF ILLUSTRATIVE EMBODIMENTS

Figure 1A:
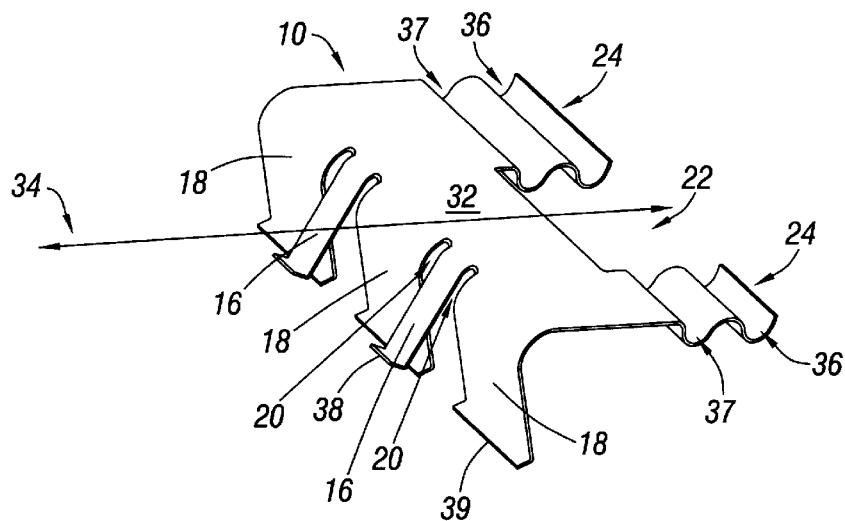
FIG. 1A is a three dimensional view of a element clip in one embodiment of the invention.
Figure 1B:
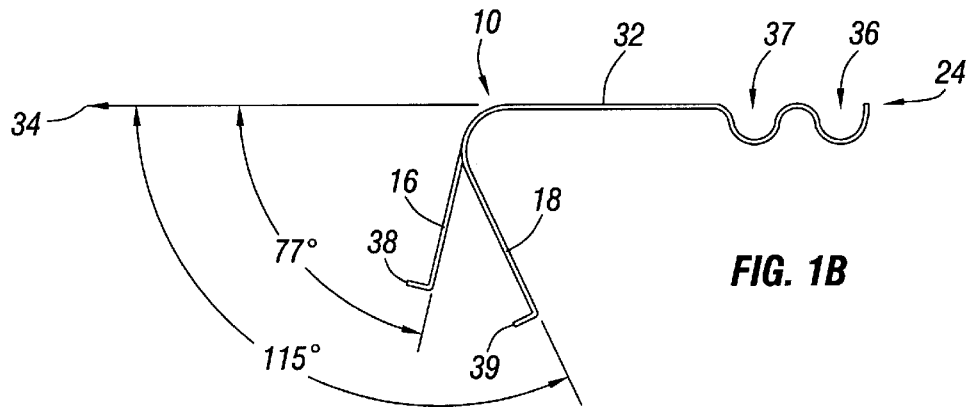
FIG. 1B is a cross sectional view showing the shape of the element clip illustrated in FIG. 1A.
Figure 1C:
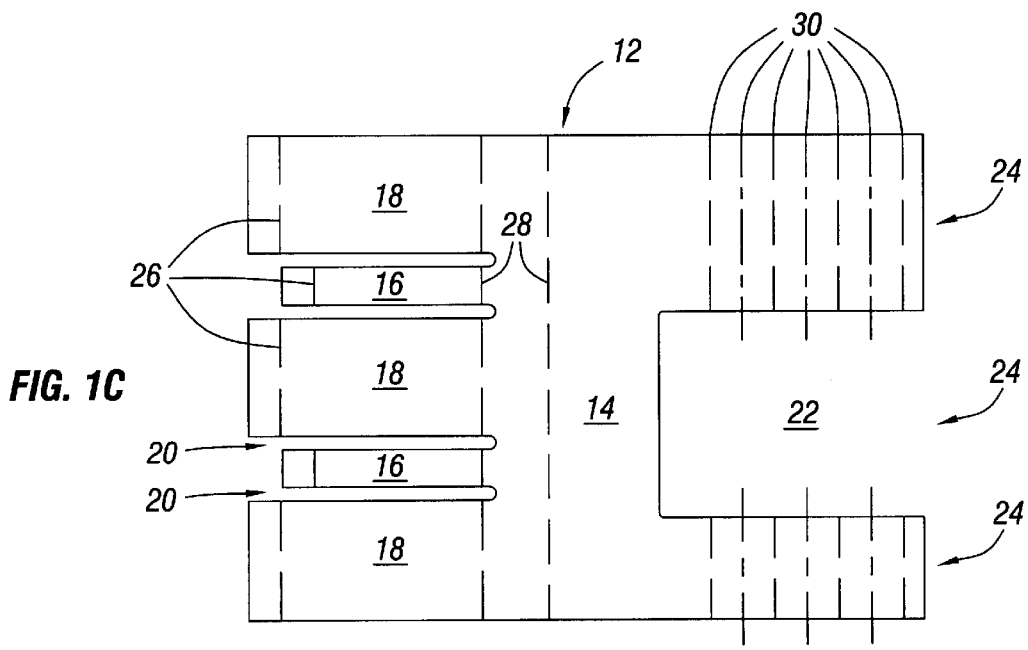
FIG. 1C shows a flat piece of metal cut to a preferred shape for forming into the element clip of FIG. 1A.

FIGS. 1A–1B are three dimensional and cross sectional views respectively of an element clip 10 in accord with one particular embodiment of the invention. FIG. 1C shows a flat metal piece 12 prior to a bending that is necessary to form the element clip 10 of FIGS. 1A–1B. The metal piece 12, in the embodiment of FIGS. 1C, comprises main body 14 having two narrow languets 16 disposed between three wider languets 18 on one side thereof. Small grooves 20 are cut between each pair of languets 16 and 18 to facilitate bending the languets 16 and 18 independently of one another. The metal piece 12 in the particular embodiment illustrated also has a slot 22 cut into its back side 24 which may be omitted in some embodiments. Though the slot 22 may be useful in certain embodiments, it is not essential to the function of the clip 10. Thus, slot 22 does not limit the scope of the present invention.

Broken lines 26, 28, and 30 in FIG. 1C indicate where the metal piece 12 is bent to form the element clip 10 of FIGS. 1A–1B. The metal piece 12 of FIG. 1C has been bent along broken lines 28 to form a substantially L-shaped cross sectional configuration of FIG. 1B. A main body 32 forms one leg of the L-shaped cross-section and the languets 16 and 18 form the other leg. The narrow languets 16 and wide 18 languets are bent through angles of 77°, and 115°, respectively from the axis 34 of the main body 32. A back side 24 of the main body 32 of the clip 10 has two semi-circular shaped furrows 36, 37 extending transversely thereacross in the particular embodiment illustrated. Tabs 38 and 39 shown in FIGS. 1A–1B are formed by bending the distal ends of languets 16 and 18, respectively, along lines 26 illustrated in FIG. 1C. The precise angle of the bend is not material to the practice of the invention so long as tabs 38 and 39 function as described below in connection with FIGS. 2–3.

Now referring to FIGS. 1A–1C, the metal piece 12, and hence the clip 10, is preferably constructed from a material, such as spring steel, that causes the languets 16, 18 to resist movement and tend to return to the configuration illustrated in FIGS. 1A–1B when deformed. While spring steel is an illustrative material, a variety of other resilient materials could be substituted therefore without departing from the spirit and scope of the invention. For example, the clip 10 could be formed from beryllium copper, stainless steel, etc. Alternatively, the clip 10 could be formed from a molded plastic in the basic configuration of FIGS. 1B–1C, if the molded plastic clip 10 has resilience sufficient to provide adequate spring force to operate in a manner described below.

Figure 2:
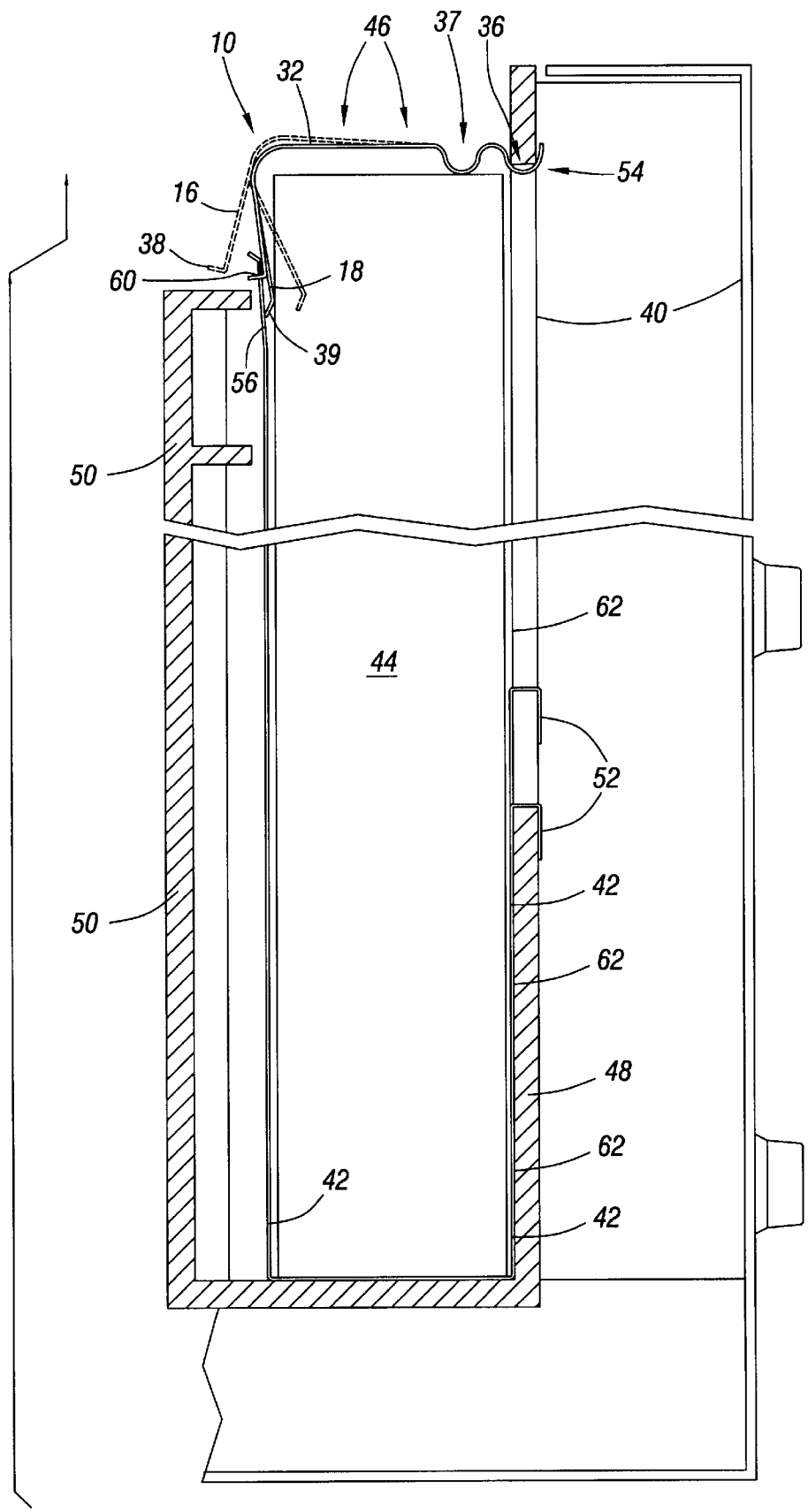
FIG. 2 is a side view of the element clip of FIGS. 1B–1C as installed in a housing.

FIG. 2 is a side, cross-sectional view illustrating a computer chassis 40, a housing 42, an element 44, and the clip 10 assembled in one particular embodiment. The element 44 slides into a housing 42 through an opening 46. Housing 42 may be fabricated from metal or molded plastic in some embodiments. In the illustrated embodiment, the housing 42 is located in a plastic card guide 48 and card guide assembly 50. Generally, the element 44 can be attached to other locations inside the chassis 40. The housing 42 is mounted to the computer frame 40 by means of, at least, two hooks 52 that engage corresponding slots in the computer chassis 40. The element 44 and housing 42 slide freely within the plastic card guide 48. The element clip 10 provides a blocking mechanism rigidly fixing the element 44 and housing 42 by prohibiting sliding within the chassis 40.

Figure 3:
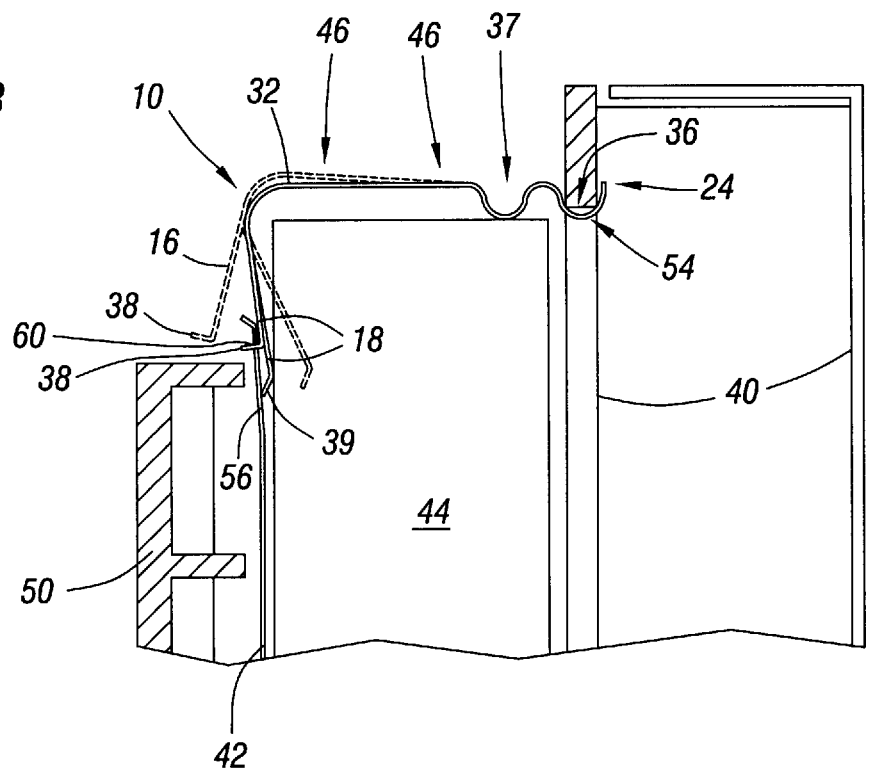
FIG. 3 is an enlarged view of a portion of FIG. 2 showing the attachment of the element clip of FIGS. 1A–1B to both a chassis frame and the housing.

FIG. 3 illustrates, in an enlarged view, the attachment and operation of the element clip 10 shown in FIG. 2. After the element 44 and housing 42 are placed inside the card guide 48 and card guide assembly 50, installation of the clip 10 generally involves three steps. First, the furrow 36 on the back side 24 of the clip 10 is hooked into a slot 54 in the chassis 40. Second, the main body 32 of the clip 10 is pivoted towards the element 44. The pivot is formed by the contact between furrow 36 of the clip 10 and the slot 54 of the chassis 40. Third, the narrow languets 16 are compressed to slide between a distal portion 56 of the housing 42 and the element 44. The distal portion 56 of the housing 42 in the particular embodiment illustrated is beveled outward to facilitate inserting the languets 16. The clip 10 is pivoted toward the element 44 until tabs 38 of the narrow languets 16 engage slots 60 in the distal end 56 of the metal housing 42.

Generally, the invention can be used to attach a variety of elements 44 to the computer chassis 40. Similar apparatus and methods can be employed to fasten various rectangular objects to the chassis 40. For example, hard disk, CD-ROM, floppy disk, and Jazz drives could all be attached to a computer chassis 40 with the present invention. The scope of the present invention is not limited to the attachment of any one of these objects 44 but rather is intended to include all similar elements.

During installation of the clip 10 the languets 16, 18 are compressed so that the angle between them decreases. In this configuration, the shorter languets 16 exert a pressure tending to straighten the clip 10, and the longer languets 18 exert a pressure that resists straightening. These two pressures work to lock the clip 10 and to hold the element 44 as shown in FIGS. 2–3 against the opposite side 62 of the housing 42 abutting the chassis 40. The exact angles of bending of the narrow 16 and wide 18 languets, shown in FIGS. 1A–1B, with respect to the main body 32 of the clip 10 are not essential as long as the languets 16, 18 perform as described above during installation. The tabs 39 aid the wide languets 18 to slide along the surface of the element 44 during installation of the element clip 10.

As noted above, the furrow 36 of the clip 10 provides an attachment to the computer chassis 40 through the pivot created by the contact of furrow 36 with slot 54. When the clip 10 is installed and locked in position, the second furrow 37 abuts against the element 44, shown in FIGS. 2–3, constraining the element 44 from sliding within the chassis 40. Other shapes for the furrows 36, 37 can perform this and/or similar functions. For example, the furrows 36, 37 can be V-shaped. Similarly, the pivoting motion may also result from a bending of the main body 32 of the clip 10. Modifications to the shape and number of furrows 36, 37, still allowing the pivoting motion of the clip 10 and pushing against the element 44 when the clip 10 is in the locked position, are within the scope of this invention.

The embodiment illustrated in FIGS. 1A–1C and 2–3 is preferably intended for use in a Micron Electronics Inc.'s ACTX computer (not shown), but it is to be understood that the scope of the invention is not so limited. For the ACTX computer, the element 44 illustrated in FIGS. 2–3 is a hard disk drive. Removal or installation of the hard disk drive 44 then involves opening the access cover (not shown) releasing or attaching the spring metal clip 10, and sliding the hard disk drive 44 out of or into the housing 42. The hard disk drive 44 is retained in the housing 42 by the spring pressure provided by the element clip 10. The installation or removal uses finger pressure and does not involve tools or entail accessing external portions of the chassis 40. Therefore, installing a hard drive 44 using the instant invention can be accomplished without removing the external bezel of the ACTX computer (not shown).

Figure 5:
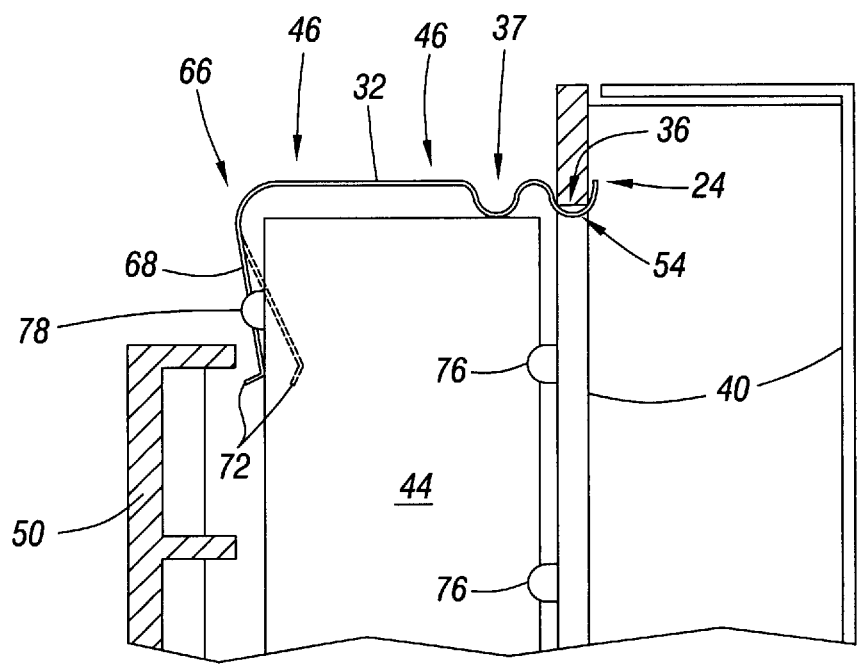
FIG. 5 is an enlarged side view of the alternate embodiment in which a mounting assembly employs an element clip but not a housing.
Figure 4A:
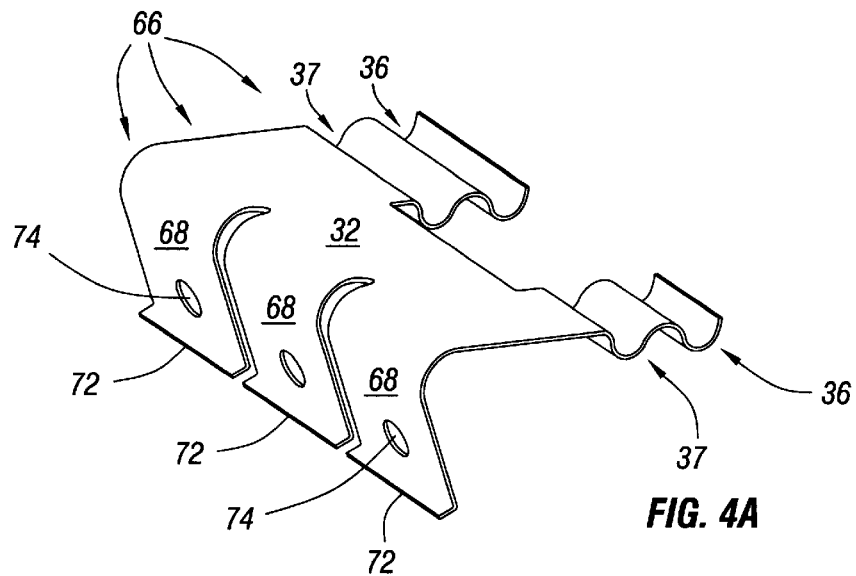
FIG. 4A is a three dimensional view of an element clip of an alternate embodiment of the invention.
Figure 4B:
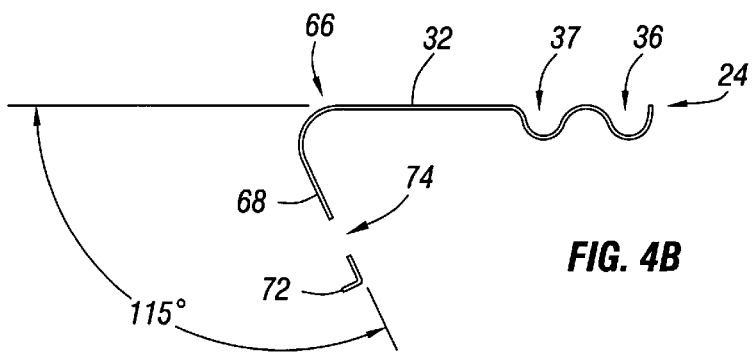
FIG. 4B is a cross sectional view showing the shape of the element clip.
Figure 4C:
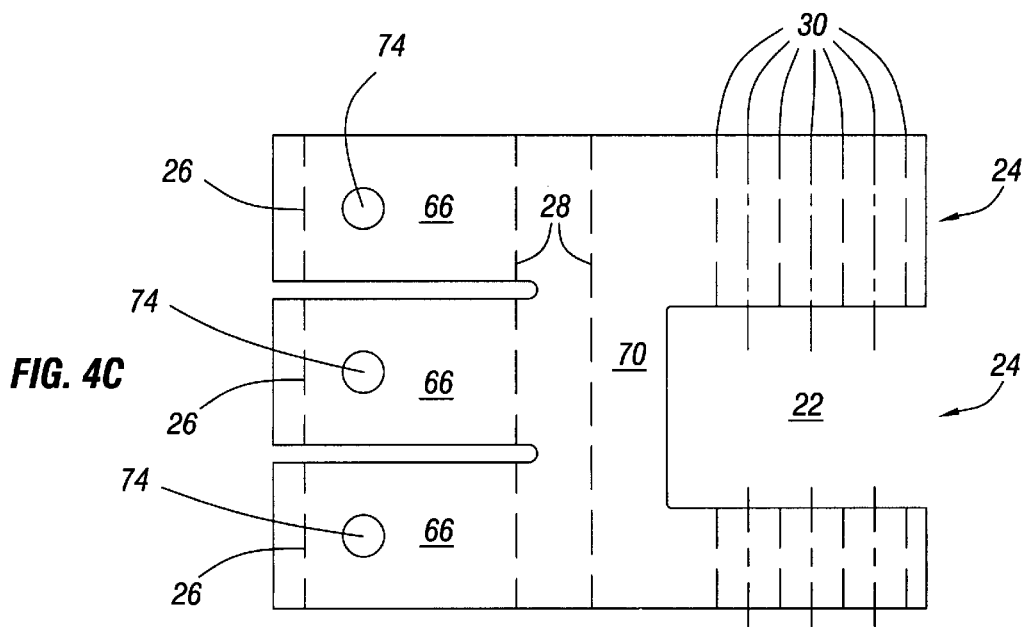
FIG. 4C shows a flat piece of metal cut to a preferred shape for forming into the element clip of FIG. 4A.

FIGS. 4A–4B illustrate an alternative embodiment shown installed in FIG. 5. The clip 66 has a substantially L-shaped cross-section formed by languets 68 and a main body 32. FIG. 4C shows a flat piece of metal 70 from which the clip 66 is fabricated by bending along the dotted lines 26, 28, 30. FIGS. 4A and 4B give three dimensional and cross-sectional views of the completed clip 66. The languets 68 have a tab 72 at their distal extremities. Each languet 68 also has a hole 74. The clip 66 has two furrows 36, 37 along an edge opposite the languets 68. The clip 66, like the clip 10 of FIGS. 1A–1B, is made from a resilient material such as spring steel, stainless steel, beryllium copper, or molded plastic.

FIG. 5 illustrates the clip 66 assembled in an alternative embodiment that entirely omits the housing 42 of the embodiment in FIGS. 2–3. In this embodiment, the element 44 is placed between protrusions 76 on the chassis 40. The protrusions 76 prevent the element 44 from sliding or separating from the chassis 40, except in one direction. One construction makes the protrusions 76 by partially punching holes in a sheet metal chassis 40. The exact form of the protrusions 76 is not essential as long as they function to stop the element from sliding similarly to the housing 42 of the embodiment of FIGS. 2–3. The element 44 is fixed from sliding in the remaining direction by the clip 66 of FIGS. 4A–4B. Thus, the protrusions 76, like the housing 42 in the embodiment of FIGS. 2–3, form a means for stopping element 44 from sliding in at least one direction when element 44 is placed on chassis 40.

Returning to FIG. 5, when inserted in a slot 54 of the chassis 40, the furrow 36 forms a pivoting connection. In the embodiment of FIGS. 4–5, the element 44 is locked in position when the wide languets 68 are slid over small bumps 78 on the side of the element 44 opposite to the side resting against the chassis 40. The bumps 78 lock the clip 66 in place when it is fully pivoted towards the element 44. In the illustrative embodiment, the bumps 78 enter holes 74 in the wide languets 68 when the clip 66 is fully pivoted toward the element 44. Thus, the languets 68, the holes 74, and the bumps 78, like the tabs 38 of narrow languets 16 and the slots 60 in the housing 42 of FIGS. 2–3, form a means for locking the clip 66 in the position shown in FIG. 5.

All methods and structures disclosed and claimed herein can be made and executed without undue experimentation in light of the present disclosure. While the apparatus and methods of this invention have been described in terms of illustrative embodiments, it will be apparent to those of skill in the art that variations may be applied to the methods and apparatus described herein without departing from the concept, spirit and scope of the invention. More specifically, it will be apparent that certain elements can be substituted for the elements described herein while the same or similar results would be achieved. All such similar substitutes and modifications apparent to those skilled in the art are deemed to be within the spirit, scope and concept of the invention as defined by the appended claims.

What is claimed is:

1. A method for mounting an element on a computer chassis comprising:
   a) stopping the element from sliding in at least one direction by placing the element between protrusions on a surface of the chassis;
   b) connecting a clip having a first and second end to the chassis, wherein the clip is joined to the chassis at the first end by hooking a furrowed edge of the clip around at least one protrusion attached to the chassis; and
   c) connecting the second end of the clip to the element by engaging holes in the clip with bumps on the element.

2. The method as set forth in claim 1, further comprising the step of pivoting said clip toward said element until languets on said clip contact the surface of said element opposite to the surface of said chassis that contacts said element, said languets being stopped from pivoting backwards by bumps on the surface of said element.

3. The method as set forth in claim 2, wherein the step of pivoting said clip toward said element further comprises the step of engaging said bumps in holes in said languets.

4. The method as set forth in claim 1, wherein the step of engaging said clip in said chassis brings languets of said clip in contact with the surface of said element opposite to the surface of said chassis in contact with said element, said languets holding said element against said chassis.

* * * * *